(12) United States Patent
Seo et al.

(10) Patent No.: US 7,906,896 B2
(45) Date of Patent: Mar. 15, 2011

(54) ORGANIC LIGHT-EMITTING DIODE DISPLAY DEVICE WITH POROUS POLYMER HEAT INSULATING MEMBER

(75) Inventors: Dong-Jin Seo, Cheonan-si (KR);
Sung-Soo Lee, Suwon-si (KR);
Yong-Woo Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 906 days.

(21) Appl. No.: 11/647,664

(22) Filed: Dec. 29, 2006

(65) Prior Publication Data

US 2008/0007159 A1 Jan. 10, 2008

(30) Foreign Application Priority Data

Jun. 8, 2006 (KR) .................. 10-2006-0051296

(51) Int. Cl.
*H01J 1/62* (2006.01)
*H01J 63/04* (2006.01)
(52) U.S. Cl. ......... 313/504; 313/498; 313/506; 313/512
(58) Field of Classification Search ........... 313/498–512
See application file for complete search history.

(56) References Cited

U.S. PATENT DOCUMENTS

| 2005/0017638 | A1* | 1/2005 | Kim ............................. 313/582 |
| 2005/0260337 | A1* | 11/2005 | Ogura et al. .................... 427/66 |
| 2006/0002064 | A1* | 1/2006 | Oooka et al. .................. 361/681 |
| 2006/0238120 | A1* | 10/2006 | Miller et al. .................. 313/506 |
| 2006/0250064 | A1* | 11/2006 | Park et al. ..................... 313/112 |
| 2007/0001591 | A1* | 1/2007 | Tanaka .......................... 313/504 |
| 2007/0013828 | A1* | 1/2007 | Cho et al. ........................ 349/65 |
| 2007/0048545 | A1* | 3/2007 | Hatwar et al. ................. 428/690 |
| 2008/0100775 | A1* | 5/2008 | Hsiao ............................. 349/65 |

* cited by examiner

*Primary Examiner* — Karabi Guharay
*Assistant Examiner* — Kevin Quarterman
(74) *Attorney, Agent, or Firm* — F. Chau & Associates, LLC

(57) ABSTRACT

An organic light-emitting diode (OLED) display device includes a display panel having an OLED element, a receiving container to receive the display panel, a driving circuit part that is disposed under the receiving container and drives the display panel, and a heat insulating member that is disposed between the display panel and the receiving container, and comprises a porous polymer. Deterioration of the light-emitting layer may be prevented and/or reduced to increase durability of the OLED display device.

10 Claims, 3 Drawing Sheets

ORGANIC LIGHT-EMITTING DIODE DISPLAY DEVICE WITH POROUS POLYMER HEAT INSULATING MEMBER

CROSS-REFERENCE TO RELATED APPLICATIONS

The present application claims priority to Korean Patent Application No. 2006-51296, filed on Jun. 8, 2006, the contents of which are incorporated by reference in their entirety.

BACKGROUND OF THE INVENTION

1. Technical Field

Embodiments of the present invention relate to an organic light-emitting diode display device. More particularly, embodiments of the present invention relate to an organic light-emitting diode display device capable of preventing and/or reducing deterioration of a light-emitting layer to increase durability.

2. Discussion of the Related Art

In general, an organic light-emitting diode (OLED) display device includes a display panel to display an image and a driving part to drive the display panel. The display panel includes an OLED element disposed between two substrates. The OLED element includes a cathode, an anode, and a light-emitting layer disposed between the cathode and the anode.

An electron provided by the cathode is combined with a hole provided by the anode in the light-emitting layer to form an exciton. The exciton radiates energy and emits light. Thus, an image is displayed on a screen of the display panel. The driving part is electrically connected to the display panel and includes an integrated circuit to drive the display panel. The driving part is disposed on a rear surface of the display panel by using, for example, a flexible printed circuit board (PCB).

The OLED display device does not need a backlight assembly since the light-emitting layer of the OLED element is self-emissive. Since the light-emitting layer radiates energy, heat is generated in the display panel. Furthermore, the driving part disposed on the rear surface of the display panel generates heat so that a temperature of the display panel is further increased. An operating temperature of a conventional OLED element is about −30 to about 80° C. Thus, when a temperature increases excessively, the light-emitting layer deteriorates so that durability of the OLED display device decreases.

SUMMARY OF THE INVENTION

Embodiments of the present invention provide an organic light-emitting diode (OLED) display device capable of preventing and/or reducing deterioration of a light-emitting layer to increase durability.

In an exemplary embodiment of the present invention, an OLED display device includes a display panel having an OLED element, a receiving container to receive the display panel, a driving circuit part that is disposed under the receiving container and drives the display panel, and a heat insulating member that is disposed between the display panel and the receiving container, and comprises a porous polymer.

In another aspect of the present invention, an OLED display device includes a display panel having an OLED element, a driving circuit part to drive the display panel, and a heat insulating member that is disposed between the display panel and the driving circuit part, and receives the display panel, and comprises a porous polymer.

In still another aspect of the present invention, an OLED display device includes a display panel and a driving circuit part. The display panel includes a first substrate having a thin-film transistor (TFT), an OLED element formed on the first substrate, and a second substrate that is combined with the first substrate to seal the OLED element and comprises a porous polymer. The driving circuit part is disposed under the second substrate and drives the display panel.

According to an exemplary embodiment of the present invention, deterioration of a light-emitting layer of an OLED element may be prevented and/or reduced to increase durability of an OLED display device.

BRIEF DESCRIPTION OF THE DRAWINGS

in FIG. 1.

DESCRIPTION OF THE EXEMPLARY EMBODIMENTS

Figure 1:
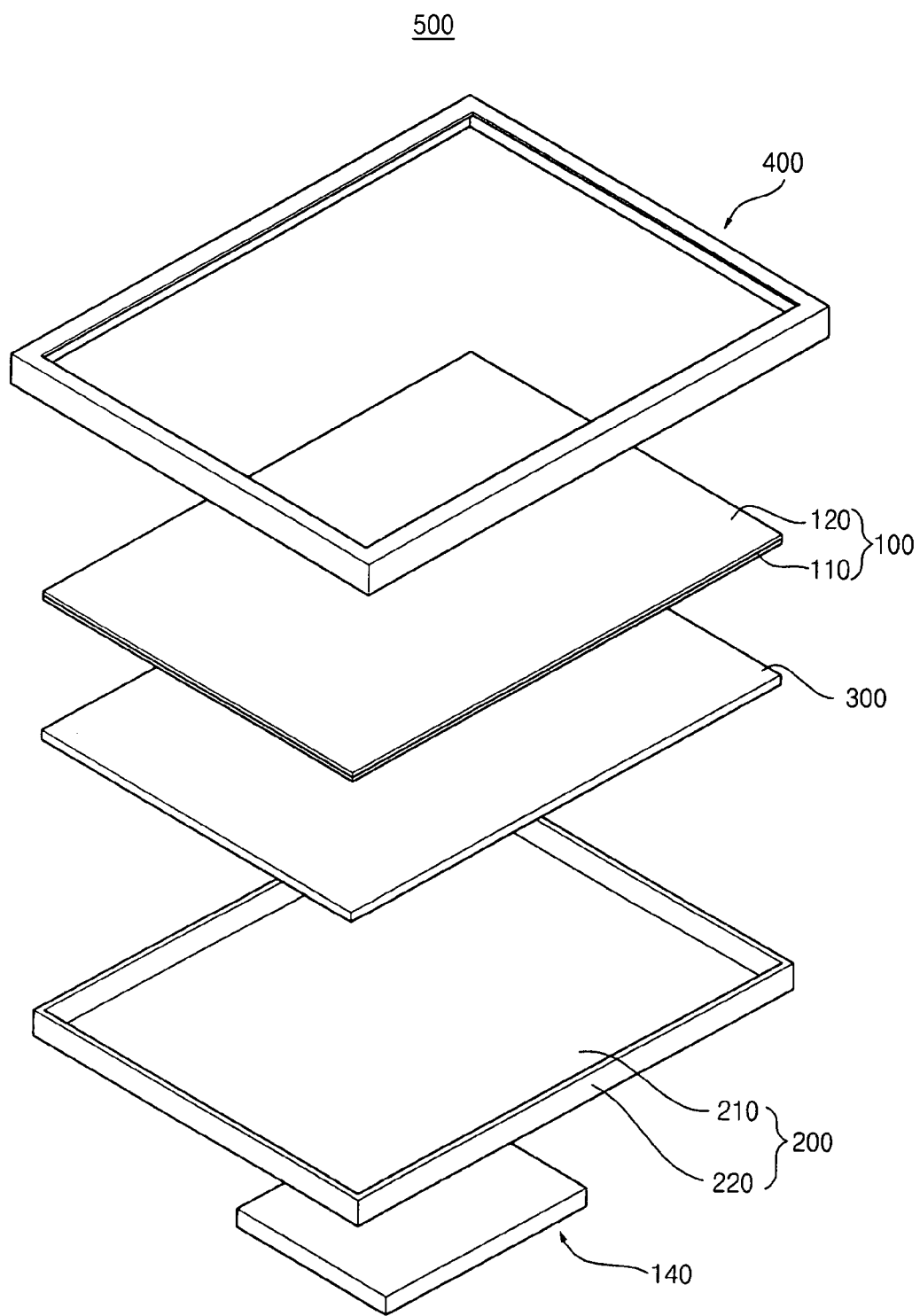
FIG. 1 is an exploded perspective view illustrating an organic light-emitting diode (OLED) display device according to an exemplary embodiment of the present invention.
Figure 2:
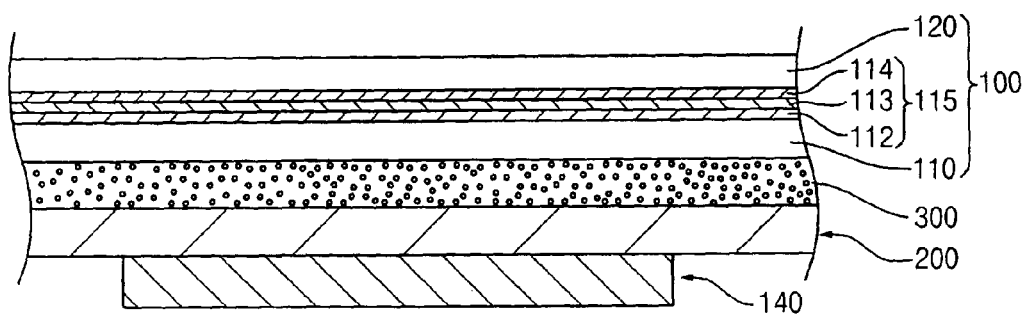
FIG. 2 is a cross-sectional view illustrating the OLED display device illustrated.

Exemplary embodiments of the invention are described more fully hereinafter with reference to the accompanying drawings, in which embodiments of the invention are shown. This invention may, however, be embodied in many different forms and should not be construed as limited to the embodiments set forth herein. It will be understood that when an element or layer is referred to as being "on," "connected to" or "coupled to" another element or layer, it can be directly on, connected or coupled to the other element or layer or intervening elements or layers may be present. FIG. 1 is an exploded perspective view illustrating an organic light-emitting diode (OLED) display device according to an exemplary embodiment of the present invention. FIG. 2 is a cross-sectional view illustrating the OLED display device illustrated in FIG. 1.

Referring to FIGS. 1 and 2, an OLED display device 500 includes a display panel 100, a receiving container 200, a driving part 140, a heat insulating member 300 and a top chassis 400.

The display panel 100 includes a first substrate 110, a second substrate 120 and an OLED element 115 disposed between the first substrate 110 and the second substrate 120.

Examples of the first substrate 110 may include a transparent substrate and an opaque substrate, which include, for example, glass. A plurality of pixels is defined on the first substrate 110 by gate lines and data lines. A thin-film transistor (TFT) is formed in each of the pixels to drive a first electrode 112 of the OLED element 115.

The second substrate 120 is disposed above the first substrate 110 and is combined with the first substrate 110 to seal the OLED element 115. The second substrate 120 may be transparent and may include glass. The second substrate 120 may be combined with the first substrate 110 using a sealing member.

The OLED element 115 is disposed between the first and second substrates 110 and 120. The OLED element 115 includes the first electrode 112, a light-emitting layer 113 and a second electrode 114, which are sequentially formed on the first substrate 110.

The first electrode 112 corresponds to each of the pixels defined on the first substrate 110. A driving voltage is applied to the first electrode 112 from the TFT. The first electrode 112 may include a transparent conductive material such as, for examples, indium tin oxide (ITO) and/or indium zinc oxide (IZO). Alternatively, the first electrode 112 may include an opaque metal.

For example, the light-emitting layer 113 may include a red light-emitting layer to emit a red light, a green light-emitting layer to emit a green light, and a blue light-emitting layer to emit a blue light. Each of the red, green and blue light-emitting layers is disposed in each of the pixels to emit the red, green and blue lights. The OLED element 115 may further include a hole injection layer, a hole transporting layer, an electron injection layer and an electron transporting layer, which are formed on and/or under the light-emitting layer 113.

The second electrode 114 is formed on the light-emitting layer 113. A common voltage is applied to the second electrode 114 from the driving circuit part 140. The first and second electrodes 112 and 114 allows current to flow to the light-emitting layer 113. The second electrode 114 may include a transparent conductive material such as, for example, ITO and/or IZO to transmit light exiting from the light-emitting layer 113.

Particularly, a driving current is applied to the first electrode 112 from the TFT, and the common voltage is applied to the second electrode 114 from the driving circuit part 140. The driving current provides the first electrode 112 with a hole, and the common voltage provides the second electrode 114 with an electron.

The hole provided to the first electrode 112 and the electron provided to the second electrode 114 are combined with each other in the light-emitting layer 113 by an electric field formed between the first and second electrodes 112 and 114. When the hole and the electron are combined with each other in the light-emitting layer 113, an exciton in an excited state is generated. The exciton drops to a ground state to generate light. Thus, the light-emitting layer 113 emits light having color so that an image is displayed on a screen of the display panel 100.

In this embodiment, the second substrate 120 is disposed above the first substrate 110. Thus, the image is displayed toward the second substrate 120. Furthermore, heat is generated in the light-emitting layer 113 due to the exciton emitting the light.

The receiving container 200 may include, for example, a metal having relatively high deformation resistance and relatively high strength. The receiving container 200 includes a bottom 210 and four side portions 220 extended from the bottom 210 in a direction substantially perpendicular to the bottom 210. Thus, a receiving space is formed in the receiving container 200 to receive the display panel 100.

The driving circuit part 140 that drives the display panel 100 is disposed on a rear surface of the receiving container 200. The driving circuit part 140 is electrically connected to the display panel 100. For example, the driving circuit part 140 may include a gate driving circuit part to provide the display panel 100 with a gate signal and the common voltage, and a data driving circuit part to provide the display panel 100 with a data signal and a power voltage.

The OLED element 115 of the display panel 100 is disposed adjacent to the driving circuit part 140. Thus, heat generated by the driving circuit part 140 may be provided to the display panel 100 to accelerate deterioration of the light-emitting layer 113.

In this embodiment, a heat insulating member 300 is disposed between the driving circuit part 140 and the display panel 100. Thus, the heat generated by the driving circuit part 140 may be prevented from being provided to the display panel 100.

Particularly, the heat insulating member 300 is disposed between the display panel 100 and the receiving container 200, and is received in the receiving container 200 with the display panel 100.

The heat insulating member 300 may include a porous polymer having relatively small heat conductivity. Particularly, examples of the heat insulating member 300 may include a porous polymer plate manufactured by a foaming injection molding method. The heat insulating member 300 may be directly formed on a rear surface of the display panel 100 through the foaming injection molding method. The heat insulating member 300 may include, for example, a polyurethane foam and/or a polystyrene foam.

Furthermore, the heat insulating member 300 may be formed by a microcellular foaming injection molding method that mixes a polymer resin with a supercritical gas to inject the mixture. The heat insulating member 300 may be directly formed on the rear surface of the display panel 100 by the microcellular foaming injection molding method.

Furthermore, examples of the heat insulating member 300 may include a different porous polymer typically applied to, for example, a refrigerator.

In this embodiment, the heat insulating member 300 is disposed between the display panel 100 and the driving circuit part 140. Thus, a temperature of the display panel 100 may be prevented from being increased by the heat generated by the driving circuit part 140. Thus, deterioration of the light-emitting layer 113 may be prevented and/or reduced to increase durability of the OLED display device 500.

The top chassis 400 is combined with the receiving container 200 to secure edges of the display panel 100. For example, the top chassis 400 may include a metal having relatively high deformation resistance and relatively high strength.

Figure 3:
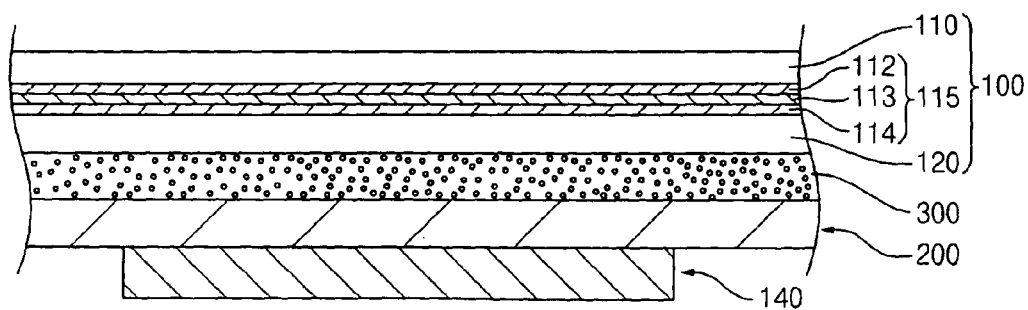
FIG. 3 is a cross-sectional view illustrating an OLED display device according to another exemplary embodiment of the present invention.

FIG. 3 is a cross-sectional view illustrating an OLED display device according to another exemplary embodiment of the present invention.

The OLED display device illustrated in FIG. 3 is substantially the same as the OLED display device illustrated in FIGS. 1 and 2 except for a disposition of a display panel.

Referring to FIGS. 2 and 3, the display panel 100 of the OLED display device 600 illustrated in FIG. 3 is reversed in comparison to the display panel of the OLED 500 illustrated in FIG. 2.

Particularly, a first substrate 110 having a TFT is disposed above a second substrate 120. The first substrate 110 may be a transparent substrate including a transparent material, and the second substrate 120 may be transparent or opaque.

An OLED element 115 disposed between the first and second substrates 110 and 120 includes a second electrode 114, a light-emitting layer 113 and a first electrode 112, which are sequentially deposited on the second substrate 120.

The first electrode 112 formed on the light-emitting layer 113 includes a transparent conductive material to transmit light exiting from the light-emitting layer 113. The second electrode 114 formed under the light-emitting layer 113 may include the transparent conductive material and/or an opaque metal.

The TFT to drive the first electrode 112 of the OLED element 115 is formed at a rear surface of the first substrate 110. A driving voltage is applied to the first electrode 112 from the TFT formed at the rear surface of the first substrate 110. A common voltage is applied to the second electrode 114 from the driving circuit part 140. The first and second electrodes 112 and 114 allows current to flow to the light-emitting layer 113 to generate light. The light generated by the light-emitting layer 113 exits from the light-emitting layer 113 toward the first substrate 110 having the TFT.

A heat insulating member 300 is disposed under the second substrate 120 to prevent heat generated by the driving circuit part 140 from being provided to the display panel 100.

Thus, a temperature of the display panel 100 may be prevented from being increased by the heat generated by the driving circuit part 140. Thus, deterioration of the light-emitting layer 113 may be prevented and/or reduced to increase durability of the OLED display device 600.

Figure 4:
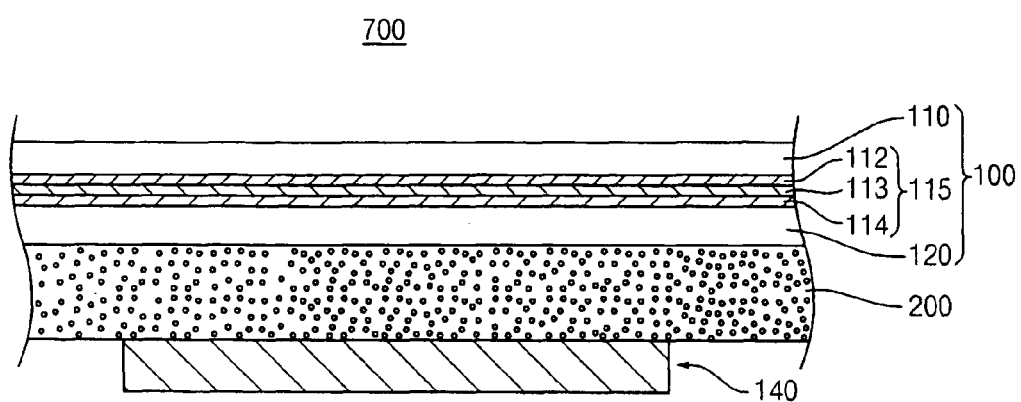
FIG. 4 is a cross-sectional view illustrating an OLED display device according to still another exemplary embodiment of the present invention.

FIG. 4 is a cross-sectional view illustrating an OLED display device according to still another exemplary embodiment of the present invention.

The OLED display device illustrated in FIG. 4 is substantially the same as the OLED display device illustrated in FIGS. 1 and 2 except that a heat insulating member is omitted and a receiving container of the OLED display device illustrated in FIG. 4 includes a heat insulating material.

Referring to FIGS. 1 and 4, the OLED display device 700 includes a display panel 100, a driving circuit part 140 to drive the display panel 100, the receiving container 200 to receive the display panel 100, and a top chassis 400. The display panel 100, the driving circuit part 140 and the top chassis 400 are substantially the same as the display panel, the driving circuit part and the top chassis illustrated in FIGS. 1 and 2.

The receiving container 200 having a heat insulating material has enough thickness to have sufficient durability for receiving and/or supporting the display panel 100.

Furthermore, the receiving container 200 includes a bottom 210 and four side portions 220 extended from the bottom 210 in a direction substantially perpendicular to the bottom 210. Thus, a receiving surface to receive the display panel 100 is formed. The driving circuit part 140 electrically connected to the display panel 100 is secured at a rear surface of the receiving container 200.

In this embodiment, the receiving container 200 includes the heat insulating material, for example, the porous polymer described in FIG. 2, and the receiving container 200 is disposed at the rear surface of the display panel 100. Thus, deterioration of the light-emitting layer 113 may be prevented and/or reduced to increase durability of the OLED display device 700. Furthermore, manufacturing costs of the receiving container 200 may be reduced in comparison to manufacturing costs of a receiving container including, for example, a metal.

Figure 5:
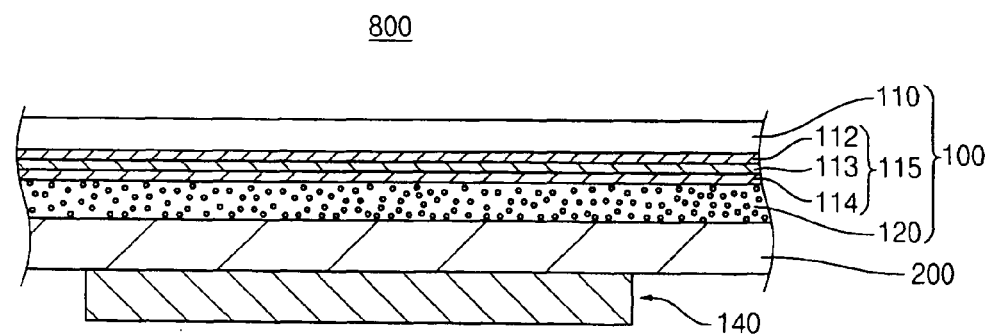
FIG. 5 is a cross-sectional view illustrating an OLED display device according to still another exemplary embodiment of the present invention.

FIG. 5 is a cross-sectional view illustrating an OLED display device according to still another exemplary embodiment of the present invention.

The OLED display device illustrated in FIG. 5 is substantially the same as the OLED display device illustrated in FIG. 3 except that a second substrate of the OLED display device includes a porous polymer.

Referring to FIG. 5, the OLED display device 800 includes a display panel 100, a receiving container 200 and a driving circuit part 140. The display panel 100 includes a first substrate 110, a second substrate 120 and an OLED element 115.

The first substrate 110 and the OLED element 115 are substantially the same as the first substrate and the OLED element illustrated in FIG. 3. The second substrate 120 includes a heat insulating material, for example, the porous polymer explained in FIG. 2, and is combined with the first substrate 110 using a sealing member.

In this embodiment, since the second substrate 120 includes the heat insulating material, heat generated by the driving circuit part 140 may be prevented from being provided to a light-emitting layer 113 of the OLED element 115. Furthermore, an auxiliary heat insulating member is not needed, and thus manufacturing costs may be reduced.

According to an embodiment of the present invention, a heat insulating member is disposed between a display panel having an OLED element and a driving circuit part disposed under the display panel. Thus, heat generated by the driving circuit part may be prevented from being provided to the display panel. Thus, deterioration of the light-emitting layer may be prevented and/or reduced to increase durability of an OLED display device.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. An organic light-emitting diode (OLED) display device comprising:
   a display panel having an OLED element;
   a receiving container receiving the display panel;
   a driving circuit part that is disposed under the receiving container wherein said receiving container is disposed between the display panel and the driving circuit part and said driving circuit part drives the display panel; and
   a heat insulating member that is disposed between the display panel and the receiving container, and comprises a porous polymer.

2. The OLED display device of claim 1, wherein the porous polymer is a polyurethane foam manufactured by a foaming injection molding method.

3. The OLED display device of claim 1, wherein the display panel comprises:
   a first substrate on which the OLED element is formed; and
   a second substrate that is disposed on the OLED element and is combined with the first substrate to seal the OLED element.

4. The OLED display device of claim 3, wherein the first substrate of the display panel faces the heat insulating member.

5. The OLED display device of claim 3, wherein the second substrate of the display panel faces the heat insulating member.

6. The OLED display device of claim 1, wherein said OLED element comprises a first electrode, a light emitting layer, and a second electrode.

7. The OLED display device of claim 6,
   wherein the driving circuit part provides the first electrode with a hole, and provides the second electrode with an electron, wherein the hole provided to the first electrode and the electron provided to the second electrode are combined with each other in the light-emitting layer generating an exciton in an excited state, wherein said exciton generates light by dropping to a ground state.

8. An OLED display device comprising:
a display panel having an OLED element;
a driving circuit part to drive the display panel; and
a heat insulating member that is disposed between the display panel and the driving circuit part, and receives the display panel, and comprises a porous polymer.

9. An OLED display device comprising:
a display panel that comprises a first substrate,
an OLED element disposed on the first substrate,
a second substrate that is combined with the first substrate to seal the OLED element and comprises a porous polymer wherein a first surface of the second substrate faces the first substrate; and
a driving circuit part that is disposed on a second surface of the second substrate, which is opposite to the first surface, and drives the display panel.

10. The OLED display device of claim 9, further comprising a receiving container receiving the display panel and disposed between said second substrate and said driving circuit part.

* * * * *